United States Patent [19]

Omura

[11] Patent Number: 5,073,895
[45] Date of Patent: Dec. 17, 1991

[54] SEMICONDUCTOR LASER
[75] Inventor: Etsuji Omura, Itami, Japan
[73] Assignee: Mitsubishi Denki Kabushiki Kaisha, Japan
[21] Appl. No.: 567,823
[22] Filed: Aug. 15, 1990

[30] Foreign Application Priority Data

Apr. 18, 1990 [JP] Japan .................... 2-102636

[51] Int. Cl.⁵ .............................. H01S 3/19
[52] U.S. Cl. ........................... 372/47; 372/46
[58] Field of Search ................... 372/47; 11/46

[56] References Cited

U.S. PATENT DOCUMENTS 4,183,038  1/1980  Namizaki et al. ............. 372/47

FOREIGN PATENT DOCUMENTS 0027622  2/1980  Japan ........................... 372/47
0199289  12/1982  Japan ........................... 372/47

OTHER PUBLICATIONS

Susaki et al., "Single Mode Transverse Junction Stripe Laser", IEEE Tokyo Section, 1978.
Kumabe et al., "High Temperature . . . GaAs Substrate", Japanese Journal of Applied Physics, vol. 18, 1979, pp. 371-374.
Bull et al., "Oxide Defined . . . DH Structures", IEEE Journal of Quantum Electronics, vol. QE-15, No. 8,8-1979, pp. 710-713.
Namizaki, "Transvrse-Junction-Stripe . . . Homojunction", IEEE nal of Quantum Electronics, vol. QE-11, No. 7,7-1975, pp. 427-431.

Primary Examiner—Georgia Epps
Attorney, Agent, or Firm—Leydig, Voit & Mayer

[57] ABSTRACT

A transverse junction stripe semiconductor laser includes a double heterostructure of a first semiconductor layer of a first conductivity type, a second semiconductor layer of the first conductivity type having a smaller energy band gap than that of the first semiconductor layer, and a third semiconductor layer of the first conductivity type having a smaller energy band gap than that of the second semiconductor layer, and an impurity region of the second conductivity type formed through part of the first, second, and third semiconductor layers, wherein the first, second, and third layers are AlGaInAs.

14 Claims, 3 Drawing Sheets

SEMICONDUCTOR LASER

FIELD OF THE INVENTION

The present invention relates to a semiconductor laser, and more particularly to a semiconductor laser of Transverse Junction Stripe (TJS) type, which produces relatively long wavelength light.

BACKGROUND OF THE INVENTION

For a semiconductor laser used as a light source in an opto electronic integrated circuit (hereinafter referred to as "OEIC"), it is required that the threshold current below the, two electrodes be provided on the same surface and that surface be flat for integration with electronic devices such as FETs. A Transverse Junction Stripe (TJS) type laser is well known in the GaAs system producing an oscillation wavelength of 0.78 to 0.9 microns satisfying the above described requirements. This type of laser is described in detail, for example, in Japanese Journal of Applied Physics, vol. 18 (1979), Supplement 18-1, pp. 371-375. A description is given here briefly with reference to the drawings.

FIG. 3 shows a schematic cross-sectional view of a GaAs system TJS laser. In figure, reference numeral 301 designates a substrate formed of semi-insulating GaAs. A lower cladding layer 302 formed of n type AlGaAs is disposed on the substrate 301, an active layer 303 formed of n type GaAs is disposed on the lower cladding layer 302, and an upper cladding layer 304 formed of n type AlGaAs is disposed on the active layer 303. These three layers constitute a double heterostructure 310 grown by liquid phase epitaxy. Reference numeral 305 designates an n type GaAs contact layer formed on the double heterostructure 310. Reference numeral 106 designates a p type diffused region formed by selectively implanting or diffusing p type impurities into the n type GaAs layer 305 and the double heterostructure 310 reaching the substrate 301. A groove 107 is produced and removes a pn junction formed in the n type GaAs contact layer 305. P side electrode 108 and n side electrode 109 are disposed on the surface of the n type GaAs contact layer 305 respectively. Reference numeral 110 designates a laser active region formed in the active layer 303 by spreading out the p type impurities from the p type diffused region 106 to the n type region by approximately 2 microns in a drive-in diffusion.

The process for producing a conventional semiconductor laser device will be described.

A double heterostructure 310 is produced on the GaAs substrate 301 by successively growing n type AlGaAs lower cladding layer 302, n type GaAs active layer 303, and n type AlGaAs upper cladding layer 304, by such as liquid phase epitaxy (LPE). In addition, n type GaAs contact layer 305 is further grown by LPE. Next, to form p type diffused region 106, Zn as p type impurity is selectively diffused into the n type GaAs layer 305 and the double heterostructure 310 at a temperature of, for example, 650° C., to reach the substrate. Thereafter a front of the p diffused region 106 is spread out, that is, diffused into the n type crystal by approximately 2 microns by heating at a temperature of 930° C. Next, a pn junction produced in the n type GaAs layer 305 (not illustrated) is removed by etching a groove 107. Thereafter, p side electrode 108 and n side electrode 109 are formed and then a TJS laser is completed.

A description will be given hereinafter of operation.

When a voltage is applied to this laser making the side of the p type diffused region positive, an electric current flows and is concentrated in the junction produced in the n type GaAs active layer 303 having the lowest pn junction diffusion potential, so that a laser oscillation occurs in an active region 110 in the n type GaAs active layer 303. Laser light is radiated in a direction perpendicular to the paper on which FIG. 3 is shown.

P side electrode 108 and n side electrode 109 are provided on the opposite surfaces of the laser as in a usual laser and the two electrodes are separated from each other by the thickness of laser chip, that is by approximately 100 microns in the up-and-downward direction. On the other hand, since a source, gate and drain electrode of an FET are on the surface of the substrate, the integration of the an FET and the conventional semiconductor laser device requires the wiring between an optical device and FET include steps. This causes, however, a problem such as breakage of wiring at an edge of a step.

As is apparent from FIG. 3, the conventional laser has both the p and n side electrodes on the same surface and this is advantageous in integration with an FET in avoiding wiring breakage at an edge of step as discussed above. With respect to the current threshold which is important in laser characteristics, a threshold current of less than 20 mA is realized in the GaAs system laser, as disclosed in the above-mentioned literature.

However, the oscillation wavelength of the GaAs system laser is 0.78 to 0.9 microns, which does not coincide with the low loss wavelength region of quartz fibers which are used in optical communication. InGaAsP has been known as a material having oscillation wavelength in the low loss wavelength region (so-called long wavelength band) of 1.3 to 1.5 microns. Therefore, the TJS structure was attempted to be applied to the InGaAsP system in order to construct a high efficiency semiconductor laser which radiates laser light of long wavelength and has an appropriate structure for OEIC.

FIG. 4 is a cross-sectional view showing a structure of a TJS InGaAsP system laser which is disclosed in IEEE Journal of Quantum Electronics, vol. QE-15(1979), pp 710-713.

In this figure, reference numerals that are the same as in FIG. 3 designate the same or corresponding parts. Reference numeral 401 designates an n type InP substrate. An n type InP lower cladding layer 402 is disposed on the n type InP substrate 401. An n type InGaAsP active layer 403 is disposed on the n type InP lower cladding layer 402. An n type InP upper cladding layer 404 is disposed on the n type InGaAsP active layer 403. The laser shown in the article has an n side electrode provided on the rear surface of the element. However, a construction like the TJS laser of FIG. 3 is possible by providing a semi-insulating substrate and providing an n side electrode on an n type region at the surface of the element.

According to this conventional laser, a double heterostructure is realized by using a combination of InP/InGaAsP instead of combination of AlGaAs/GaAs. Because the energy band gap of InGaAsP is smaller than that of InP, current is concentrated in a pn junction formed in InGaAsP. The operation principle is the same as that of the GaAs system TJS laser. However, this TJS laser does not oscillate at room temperature and a 100 mA threshold value is obtained only at low temperature such as 100° K. The reason why a high threshold current was required has never been clarified until now.

Our investigation has revealed the reason why the threshold current is high in the InGaAsP system TJS laser.

In the InGaAsP system the impurity concentration of Zn diffused p region is at most $5 \times 10^{18}$ cm$^{-3}$, which is by one order of magnitude lower than that of the GaAs system material, and the resistivity of p region is large. When the resistivity of p region is large, the voltage drop to the active layer from the electrode is large and a large voltage needs to be applied in order to make an electric current flow in the active region. Therefore, a voltage exceeding the diffusion potential is applied to the InP-pn junction outside of the active region. As a result, the leakage current flows into a pn junction in InP where no current is designed to flow, resulting in a large oscillation current threshold for the laser.

Due to being constructed as described above, the conventional long wavelength TJS laser has disadvantages in that it can not oscillate at room temperature and its oscillation current threshold is too high to be practical.

SUMMARY OF INVENTION

The present invention is directed to solving the above described problems, and has for its object to provide a practical long wavelength system TJS laser.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

The semiconductor laser in accordance with the present invention is a TJS semiconductor laser in which an active layer and a cladding layer comprise AlGaInAs.

An AlGaInAs semiconductor can have an energy band gap of approximately 0.9 to 1.5 microns measured in oscillation wavelength by changing the composition fractions of the four elements and can be used as semiconductor material for a long wavelength laser. In addition, the AlGaInAs semiconductor achieves a high impurity concentration, as much as that of GaAs, by impurity diffusion of such as Zn and realizes a high concentration p type region that is indispensable for a TJS laser. Therefore, a practical long wavelength TJS laser can be realized.

Here, it is for the first time disclosed by the inventor that Zn is diffused into AlGaInAs. It has never previously been known that a high concentration p type region can be realized in AlGaInAs by diffusion.

DETAILED DESCRIPTION OF THE PREFERRED EMBODIMENTS

An embodiment of the present invention will be described in detail with reference to the drawings.

Figure 1:
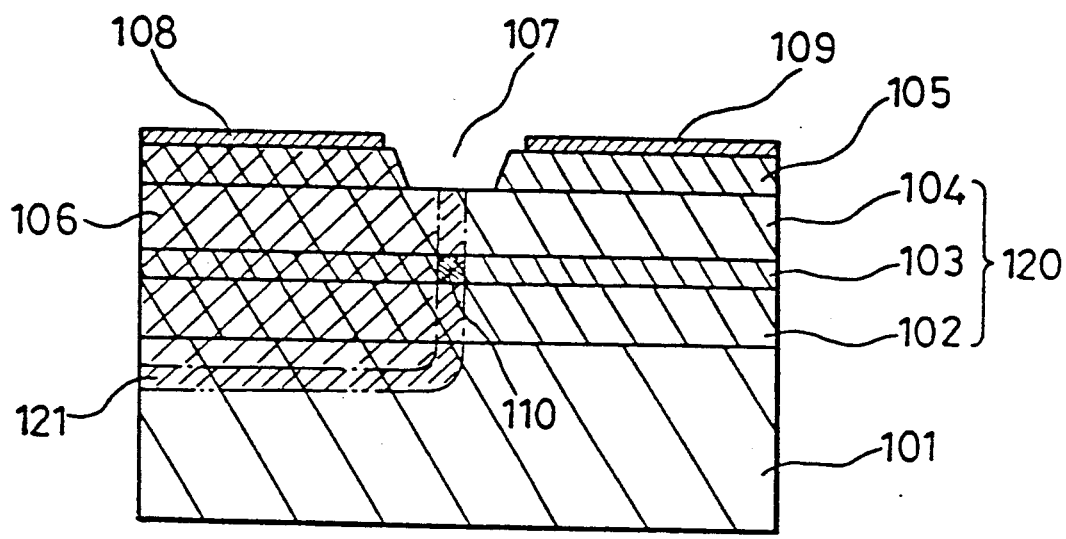
FIG. 1 is a cross-sectional view showing a semiconductor laser in accordance with a first embodiment of the present invention.

FIG. 1 is a schematic cross-sectional view showing a structure of semiconductor laser in accordance with an embodiment of the present invention. In this figure, reference numeral 101 designates a semi-insulating InP substrate. A lower cladding layer 102 formed of n type $Al_yGa_xIn_{1-x-y}As$ is disposed on the substrate 101, an active layer 103 formed of n type $Al_wGa_zIn_{1-w-z}As$ is disposed on the lower cladding layer 102, an upper cladding layer 104 formed of n type $Al_yGa_xIn_{1-x-y}As$ is disposed on the active layer 103, and these three layers 102, 103, 104 constitute a double heterostructure 105 produced by liquid phase epitaxy. An n type $In_{0.53}Ga_{0.47}As$ layer 105 is disposed on the double heterostructure 120. Reference numeral 106 designates a p type diffused region formed by selectively diffusing p type impurities into the n type $In_{0.53}Ga_{0.47}As$ layer 105 and the double heterostructure 120 reaching the substrate. A groove 107 which removes a pn junction is produced in the n type $In_{0.53}Ga_{0.47}As$ layer 105. P side electrode 108 and n side electrode 109 are disposed on respective surfaces of n type $In_{0.53}Ga_{0.47}As$ layer 105. In addition, reference numeral 110 designates a laser active region produced in the active layer 103 by spreading the p type impurities from the p type diffused region 106 into the n type region by about 2 microns in a drive-in diffusion.

A description will be given of a production process of this embodiment.

At first, layers from the n type $Al_yGa_xIn_{1-x-y}As$ lower cladding layer 102 to the n type $Al_yGa_xIn_{1-x-y}As$ upper cladding layer 104 are successively epitaxially grown on the semi-insulating InP substrate 101 using a metal organic chemical vapor deposition to produce a double heterostructure 120 and then an n type $In_{0.53}Ga_{0.47}As$ layer 105 is grown. In order that these three layers have a lattice match with the InP substrate, it is known that $x+y$ of $Al_yGa_xIn_{1-x-y}As$ should be approximately 0.47. Therefore, in this embodiment, it is required that only $x+y$ of the lower and upper cladding layers 102 and 103 be 0.47 and also $w+z$ of the active layer 103 be 0.47.

The appropriate thickness of the lower cladding layer 102 is about 2.0 microns, that of the active layer 103 about 0.12 microns, that of the upper cladding layer 104 about 2.5 microns, and that of the InGaAs layer 105 about 0.8 microns. The energy band gap of the active layer 103 should be smaller than that of the upper and lower cladding layers. For example, the appropriate energy band gap of the active region is 0.95 eV (1.3 microns in oscillation wavelength), while that of the upper and lower cladding layers is 1.35 eV. The energy band gaps of the upper and the lower cladding layers need not be the same and can be selected arbitrarily so long as they are larger than that of the active layer. The appropriate concentration of n type impurity in the upper and the lower cladding layer is $5 \times 10^{17}$ cm$^{-3}$, while that of the active layer is $3 \times 10^{18}$ cm$^{-3}$. Si, Se or S can be utilized as the n-type impurity.

Following the epitaxial growth, a SiN film is formed on the surface of the InGaAs layer 106 by thermal CVD or the like, thereafter, the SiN film is removed to form a window by usual photolithography and chemical etching steps. Next, Zn is diffused through the window to reach the lower cladding layer 102 or the substrate 101. The diffusion is implemented using a so-called closed tube diffusion or a solid phase diffusion.

The diffusion of Zn into AlGaInAs has never been implemented. An experimental Zn diffusion conducted by the inventor invited the inventor to the present invention. The inventor utilized a solid phase diffusion.

A description will be given hereinafter of a process for Zn diffusion utilizing a solid phase diffusion.

Figure 5:
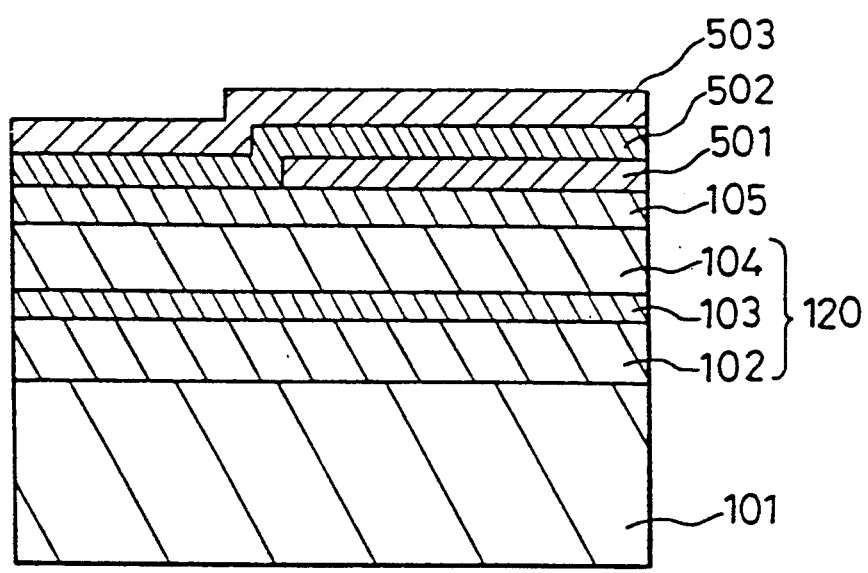
FIG. 5 is a diagram for explaining Zn diffusion by solid phase diffusion.

FIG. 5 shows a process for Zn diffusion for producing a laser of this embodiment. In this figure, reference numerals the same as those of FIG. 1 designate the same or corresponding parts. Reference numeral 501 designates a SiN film, reference numeral 502 designates a ZnO film, and reference numeral 503 designates a SiO$_2$ film.

A mask comprising a SiN film 501 having an aperture and disposed on a surface of InGaAs layer 105 is prepared. A ZnO film 502 is deposited on the mask and through the aperture by sputtering to a thickness of 1500 Å. Additionally, to protect the ZnO film 502, a SiO$_2$ film 503 is formed on the ZnO film 502. This structure is heated and annealed at 600° C. in a nitrogen ambient to diffuse Zn into AlGaInAs. At this time, the velocity of diffusion is approximately 2.2 microns/$\sqrt{hr}$. Therefore, in order that Zn reaches the substrate under these condition, the diffusion should be carried out for about four hours. In the p type diffused region 106 the impurity concentration is for the first time found to be approximately $2 \times 10^{20}$ cm$^{-3}$ and its resistivity to be $2.5 \times 10^{-3} \Omega$ cm. This value is almost the same as that in GaAs, and thus a TJS laser can be realized using AlGaInAs material.

After the diffusion, ZnO and SiN are removed and SiN is again placed on the surface of wafer, followed by annealing at 800° to 900° C. Then, the diffusion front spreads out by about 2 to 3 microns in the same manner as in GaAs TJS laser, thus resulting a drive-in diffused region 121 where the average impurity concentration is approximately $5 \times 10^{19}$ cm$^{-3}$. As a result, an active region 110 is formed in the active layer 103. Next, a pn junction formed in the InGaAs surface layer 105 is removed by etching. The solution used for etching is made from sulfuric acid, hydrogen peroxide and water being mixed in the ratio of 3 to 1 to 1. Thereafter, a p side electrode and an n side electrode are formed, thus an AlGaInAs TJS laser is completed. A metal comprising a triple layer of nickel-gold/germanium-gold, or a metal comprising a single layer of gold is used for the electrodes. In this embodiment, in order to lower the contact resistance of the electrodes, an InGaAs layer having a smaller energy band gap is provided on the surface, but this InGaAs layer is not necessarily required. In that case the process of removing the pn junction is not required.

The operation of this laser will be described.

Figure 3:
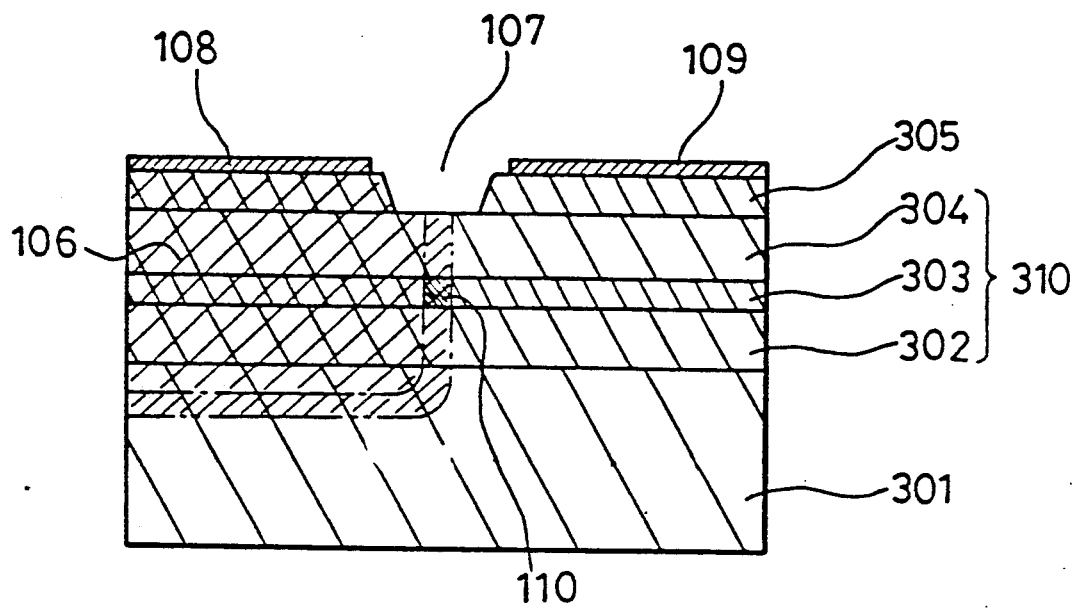
FIG. 3 is a cross-sectional view showing a structure of a conventional GaAs system TJS semiconductor laser.
Figure 4:
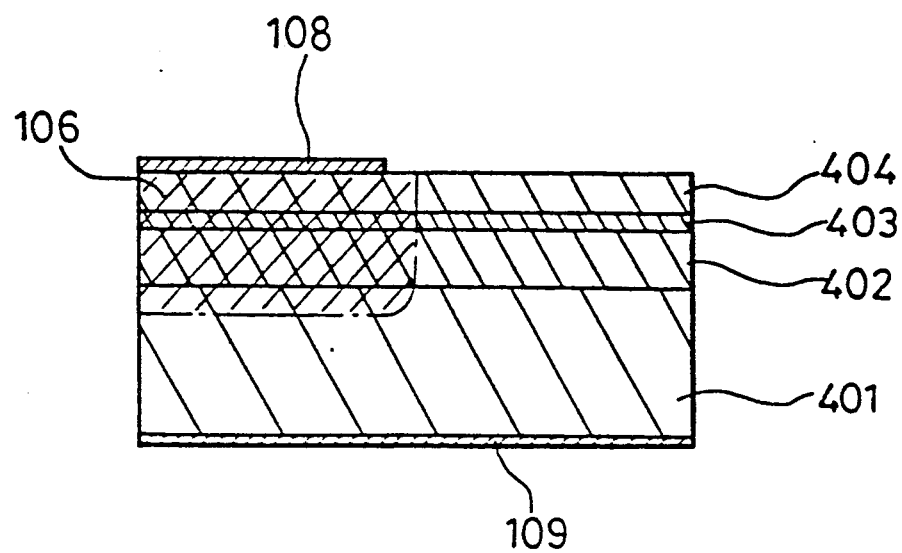
FIG. 4 is a cross-sectional view showing a structure of a conventional InGaAsP system TJS semiconductor laser.

When a voltage is applied to this TJS laser such that the p side electrode 108 is positive, the phenomenon arising in the InGsAsP-TJS laser of FIG. 4 (resistance of Zn diffused region is high and the voltage drop is large) does not arise, and current is concentrated in the active layer based on the same principle as the case of GaAs-TJS laser shown in FIG. 3, and oscillation occurs at a low threshold current value.

In this way, according to this embodiment, because the active layer and the cladding layer of TJS laser comprise AlGaInAs, the impurity concentration of Zn diffusion is sufficiently raised and a practical long wavelength TJS laser is obtained.

Figure 2:
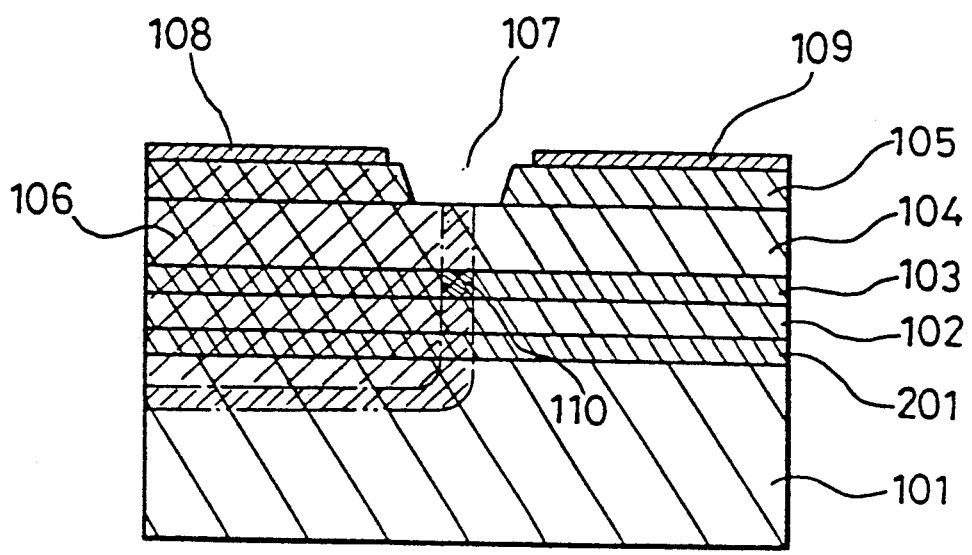
FIG. 2 is a cross-sectional view showing a semiconductor laser in accordance with a second embodiment of the present invention.

FIG. 2 is a schematic cross-sectional view showing a structure of semiconductor laser in accordance with a second embodiment of the present invention. In this figure, the same reference numbers represent the same portions as FIG. 1. Reference numeral 201. designates p type Al$_s$Ga$_t$In$_{1-s-t}$As blocking layer (s+t≈0.47).

In this second embodiment, a p type AlGaInAs layer 201 is put between the lower cladding layer 102 and the substrate 101. This layer prevents a reactive current from flowing through the substrate from p type diffused region 106 in a case where a semi-insulating InP substrate changes its conductivity type. Therefore, in this second embodiment, the substrate is not required to be semi-insulating but it can be conductive. By recent substrate fabrication techniques, a conductive substrate including more impurities and with better crystallinity than that of semi-insulating substrates can be easily obtained. Accordingly, when a substrate of high crystallinity is used, this second embodiment is quite effective.

In the above-illustrated embodiment, AlGaInAs is grown on an InP substrate, but AlGaInAs double heterostructure layers in a structure can also be grown a GaAs substrate or a Si substrate via a buffer layer, as is apparent from the above description.

Furthermore, although a buried structure that requires two epitaxial growth steps is conventionally used for practical long wavelength semiconductor lasers, the present invention realizes a high efficiency long wavelength semiconductor with only one growth step, whereby the yield is improved and the production cost is reduced.

As described above, in a TJS type semiconductor laser in accordance with the present invention, a double heterostructure comprises AlGaInAs. Therefore, an effective impurity concentration can be obtained by diffusion, and a long wavelength laser appropriate to OEIC can be realized.

What is claimed is:

1. A transverse junction stripe semiconductor laser comprising:
    a semiconductor substrate;
    a double heterostructure including, successively disposed, a semiconductor first cladding layer of a first conductivity type having a first energy band gap, a semiconductor active layer of the first conductivity type having an energy band gap smaller than that of said first semiconductor layer, and a semiconductor second cladding layer of the first conductivity type having an energy band gap larger than that of said second semiconductor layer, said first cladding layer being disposed on said substrate;
    an impurity region of a second conductivity type extending through part of said first cladding, active, and second cladding layers and producing the second conductivity type in the part of said first cladding, active, and second cladding layers through which the region extends wherein said first cladding, active, and second cladding layers are AlGaInAs;
    a semiconductor contact layer including first and second portions, said first portion being disposed on said second cladding layer on said impurity region and said second portion being disposed on said second cladding layer outside said impurity region; and first and second electrodes respectively disposed on said first and second portions of said contact layer.

2. A semiconductor laser as defined in claim 1, wherein said first cladding, active, and second cladding layers of the first conductivity type are n type AlGaInAs and said impurity region contains Zn as the impurity producing the second, p type, conductivity.

3. A semiconductor laser as defined in claim 1, wherein said first cladding, active, and second cladding layers are $Al_yGa_xIn_{1-x-y}As$ and $x+y$ is approximately 0.47.

4. A semiconductor laser as defined in claim 1, wherein impurities from said impurity region are diffused into a first conductivity region is said first cladding, active, and second cladding layers to form a laser active region in said second semiconductor layer.

5. A semiconductor laser as defined in claim 1, including a second conductivity type semiconductor blocking layer disposed on said substrate wherein said first cladding layer is disposed on said blocking layer.

6. A semiconductor laser as defined in claim 5, wherein said substrate is a conductive substrate.

7. A semiconductor laser as defined in claim 2, including a p type AlGaInAs blocking layer disposed on said substrate wherein said first cladding layer is disposed on said blocking layer.

8. A semiconductor laser as defined in claim 7, wherein said substrate is a conductive substrate.

9. A semiconductor laser as defined in claim 1, wherein said substrate is selected from GaAs and Si and including a semiconductor buffer layer disposed on said substrate wherein said first cladding layer is disposed on said buffer layer.

10. A semiconductor laser as defined in claim 1 wherein the energy band gaps of the first and second cladding layers are different.

11. A semiconductor laser as defined in claim 1 wherein the energy band gaps of the first and second cladding layers are substantially the same.

12. A semiconductor laser as defined in claim 11 wherein the energy band gaps of said first semiconductor cladding and second semiconductor active layers are about 1.35 eV and 0.95 eV, respectively.

13. A semiconductor laser as defined in claim 3, including a p type $Al_sGa_tIn_{1-s-t}As$ blocking layer disposed on said substrate wherein $s+t$ is approximately 0.47 and said first cladding layer is disposed on said blocking layer.

14. A semiconductor laser as defined in claim 3, wherein said substrate is semi-insulating InP.

* * * * *